United States Patent
Wang

(10) Patent No.: US 9,985,245 B2
(45) Date of Patent: May 29, 2018

(54) ORGANIC LIGHT EMITTING DEVICE, MANUFACTURING METHOD THEREOF AND DISPLAY DEVICE

(71) Applicant: BOE TECHNOLOGY GROUP CO., LTD., Beijing (CN)

(72) Inventor: Yulin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 14/761,881

(22) PCT Filed: Jan. 7, 2015

(86) PCT No.: PCT/CN2015/070265
§ 371 (c)(1),
(2) Date: Jul. 17, 2015

(87) PCT Pub. No.: WO2016/033923
PCT Pub. Date: Mar. 10, 2016

(65) Prior Publication Data
US 2016/0276624 A1 Sep. 22, 2016

(30) Foreign Application Priority Data

Sep. 3, 2014 (CN) .......................... 2014 1 0447024

(51) Int. Cl.
*H01L 51/52* (2006.01)
*H01L 51/56* (2006.01)
*H01L 27/32* (2006.01)

(52) U.S. Cl.
CPC .......... *H01L 51/5253* (2013.01); *H01L 51/56* (2013.01); *H01L 27/32* (2013.01)

(58) Field of Classification Search
CPC .......... H01J 1/70; H01J 9/22; H01L 51/5237; H01L 51/54; H01L 51/56
See application file for complete search history.

(56) References Cited

U.S. PATENT DOCUMENTS

2005/0239294 A1* 10/2005 Rosenblum .............. B05D 1/60
438/778
2012/0146492 A1* 6/2012 Ryu .................... H01L 51/5256
313/512
(Continued)

FOREIGN PATENT DOCUMENTS

CN 101128074 A 2/2008
CN 101766054 A 6/2010
(Continued)

OTHER PUBLICATIONS

CN201410447024.1 First Office Action and English Translation Thereof dated Mar. 17, 2016.
(Continued)

*Primary Examiner* — Jay C Chang
*Assistant Examiner* — Mikka Liu
(74) *Attorney, Agent, or Firm* — Nath, Goldberg & Meyer; Joshua B. Goldberg

(57) ABSTRACT

The present invention provides an organic light emitting device, a manufacturing method thereof and a display device. In the organic light emitting device provided by the present invention, a first inorganic thin film entirely covers a pre-encapsulation layer and an organic light emitting unit, and the first inorganic thin film has a denser molecular structure compared with the pre-encapsulation layer, thereby more effectively preventing water and oxygen from invading the organic light emitting unit via the pre-encapsulation layer to influence the service life of the organic light emitting unit.

16 Claims, 1 Drawing Sheet

(56) References Cited

U.S. PATENT DOCUMENTS

| | | | |
|---|---|---|---|
| 2013/0285024 A1* | 10/2013 | Ma | H01L 51/52 257/40 |
| 2014/0070195 A1 | 3/2014 | Choi et al. | |
| 2014/0138645 A1 | 5/2014 | Ryu | |

FOREIGN PATENT DOCUMENTS

| | | |
|---|---|---|
| CN | 102623648 A | 8/2012 |
| CN | 103325960 A | 9/2013 |

OTHER PUBLICATIONS

Forms PCT/ISA/210, PCT/ISA/220, and PCT/ISA/237 of PCT/CN2015/070265 and the English translation of the written opinion of the International Searching Authority, form PCT/ISA/237.

Office Action dated Oct. 27, 2016 issued in corresponding Chinese Application No. 201410447024.1.

Office Action dated Apr. 17, 2017 issued in corresponding Chinese Application No. 201410447024.1.

\* cited by examiner

ORGANIC LIGHT EMITTING DEVICE, MANUFACTURING METHOD THEREOF AND DISPLAY DEVICE

This is a National Phase Application filed under 35 U.S.C. 371 as a national stage of PCT/CN2015/070265, filed Jan. 7, 2015, an application claiming the benefit of Chinese Application No. 201410447024.1, filed Sep. 3, 2014, the content of each of which is hereby incorporated by reference in its entirety.

FIELD OF THE INVENTION

The present invention relates to the field of display technology, and particularly relates to an organic light emitting device, a manufacturing method thereof and a display device.

BACKGROUND OF THE INVENTION

In the field of photoelectric display technology, an organic light emitting device (referred to as OLED) has the advantages of active light emission, high brightness, high contrast, ultra thinness, low power consumption, wide view angle, wide working temperature range and the like, and is a widely used, advanced and novel flat panel display device.

However, due to the inherent characteristics of the organic material, the organic material is liable to absorb water and oxygen and is prone to loss and deterioration after being subjected to water and oxygen corrosion, such that the service life of the device is greatly influenced, and accordingly the OLED device has high requirements on encapsulation.

At present, the encapsulation technology of the OLED device has become more and more mature, and includes traditional encapsulation of a glass cover or a metal cover and a drying piece, face encapsulation (Face Encap), frit encapsulation (Frit Encap), thin film encapsulation (TFE, Thin Film Encap), etc.

The thin film encapsulation technology has prominent advantages of reducing the weight and thickness of the device, reducing encapsulation accessories, lowering the encapsulation cost, decreasing the width of an encapsulation edge, eliminating display dead angles, and improving the curling flexibility, etc.

The structure of the OLED subjected to the thin film encapsulation in the prior art is as shown in FIG. 1, which includes a substrate 1, an organic light emitting unit 2 arranged on the substrate 1 and a pre-encapsulation layer 3 covering the organic light emitting unit 2, wherein an organic thin film 5 is deposited on the pre-encapsulation layer 3 for encapsulation to form the organic light emitting device.

As shown in FIG. 2, a general organic light emitting unit 2 includes a first electrode 201, a second electrode 203 and an organic functional layer 202 between the first electrode and the second electrode, wherein the first electrode 201 and the second electrode 203 provide holes and electrons to the organic functional layer 202 for emitting light; a buffer layer 204 is arranged on the second electrode 203 for protection; an insulating layer 205 is arranged between the first electrode 201 and the organic functional layer 202.

The encapsulation layer 3 is deposited at lower power, in order to reduce the damage of the deposition process to the organic light emitting unit 2.

The organic thin film 5 is prepared by forming a fluidal organic matter into a film and curing (ultraviolet curing) the film, since the organic thin film may shrink or expand in the curing process, the organic thin film will drive the pre-encapsulation layer 3 to shrink or expand, so as to generate a stress on the organic light emitting unit 2, and the stress will damage the organic light emitting unit 2.

Meanwhile, the organic thin film 5 is liable to absorb water and oxygen to deform to generate loss, or the water and oxygen absorbed by the organic thin film 5 are further transferred to the organic light emitting unit 2 to shorten the service life of the organic light emitting unit 2.

SUMMARY OF THE INVENTION

The purpose of the present invention is to provide an organic light emitting device, a manufacturing method thereof and a display device, for solving the problems in the prior art that an organic thin film in the organic light emitting device generates a stress to easily damage an organic light emitting unit in a curing process, meanwhile the organic thin film is liable to absorb water and oxygen to generate damage or transfer the water and oxygen to the organic light emitting unit to shorten the service life of the organic light emitting unit.

The technical solution used for solving the technical problems in the present invention is an organic light emitting device, including a substrate, an organic light emitting unit arranged on the substrate and a pre-encapsulation layer covering the organic light emitting unit; wherein a first inorganic thin film is arranged on the pre-encapsulation layer.

Preferably, at least one thin film group is sequentially arranged on the first inorganic thin film, and each thin film group is composed of an organic thin film and an inorganic thin film.

Preferably, 2-10 thin film groups are arranged.

Preferably, the projection area of the first inorganic thin film on the substrate is larger than or equal to the projection area of the pre-encapsulation layer on the substrate.

Preferably, in each thin film group, the inorganic thin film covers the organic thin film.

Preferably, the thickness of the organic thin film is 100-2000 nm.

Preferably, the organic thin film is prepared from any one of parylene, polyurea and acrylic resin.

Preferably, the thickness of the inorganic thin film is 100-500 nm.

Preferably, the inorganic thin film is prepared from any one of $Al_2O_3$, SiN, $SiO_2$, SiNO, $TiO_2$, $ZrO_2$, ZnO, $MgF_2$ and ZnS.

Preferably, the projection area of the pre-encapsulation layer on the substrate is larger than the projection area of the organic light emitting unit on the substrate.

Preferably, the peripheries of all the inorganic thin films are in contact with each other and are mutually overlapped, and all the organic thin films are wrapped in the inorganic thin films at intervals.

The technical solution used for solving the technical problems in the present invention is a manufacturing method of the organic light emitting device, including:
  forming a pre-encapsulation layer on a substrate provided with an organic light emitting unit, wherein the pre-encapsulation layer covers the organic light emitting unit; and
  forming a first inorganic thin film on the pre-encapsulation tion layer.

Preferably, the manufacturing method of the organic light emitting device further includes: sequentially forming at least one thin film group on the first inorganic thin film, wherein each thin film group includes an organic thin film and an inorganic thin film.

Preferably, in each thin film group, the inorganic thin film covers the organic thin film.

In the organic light emitting device and the manufacturing method thereof provided by the present invention, the first inorganic thin film entirely covers the pre-encapsulation layer and the organic light emitting unit, and has a denser molecular structure compared with the pre-encapsulation layer, thereby effectively preventing water and oxygen from invading the organic light emitting unit via the pre-encapsulation layer to influence the service life of the organic light emitting unit.

Figure 1:
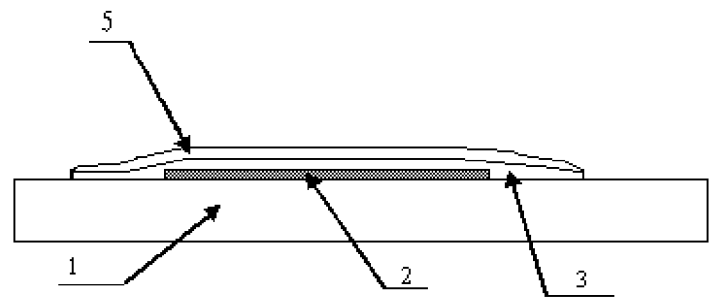
FIG. 1 is a schematic diagram of a structure of an encapsulated organic light emitting device in the prior art.
Figure 2:
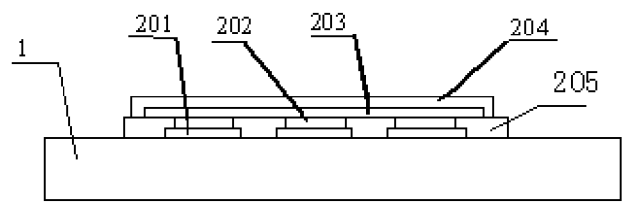
FIG. 2 is a schematic diagram of a structure of an organic light emitting unit in the organic light emitting device in the prior art.

DESCRIPTION OF REFERENCE NUMERALS 1. substrate; 2. organic light emitting unit; 3. pre-encapsulation layer; 4. inorganic thin film; 41. first inorganic thin film; 5. organic thin film; 201. first electrode; 202. organic functional layer; 203. second electrode; 204. buffer layer; 205. insulating layer.

DETAILED DESCRIPTION OF THE EMBODIMENTS

In order that those skilled in the art can better understand the technical solution of the present invention, a further detailed description of the present invention will be given below in combination with the accompanying drawings and specific implementations.

Embodiment 1

Figure 3:
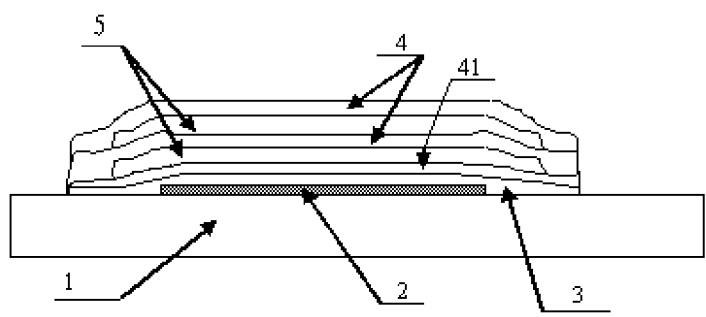
FIG. 3 is a schematic diagram of a structure of an encapsulated organic light emitting device in embodiment 1 of the present invention.

As shown in FIG. 3, this embodiment provides an organic light emitting device, including a substrate 1, an organic light emitting unit 2 arranged on the substrate 1 and a pre-encapsulation layer 3 covering the organic light emitting unit 2; wherein a first inorganic thin film 41 is arranged on the pre-encapsulation layer 3.

The first inorganic thin film 41 has a denser molecular structure compared with the pre-encapsulation layer 3, for example, the first inorganic thin film can be formed at higher power (for example, deposition power). The first inorganic thin film 41 entirely covers the pre-encapsulation layer 3 and the organic light emitting unit 2 to prevent water and oxygen from invading the organic light emitting unit 2 via the pre-encapsulation layer 3 to influence the service life of the organic light emitting unit 2.

Preferably, at least one thin film group is sequentially arranged on the first inorganic thin film 41, and each thin film group is composed of an organic thin film 5 and an inorganic thin film 4.

Since the first inorganic thin film 41 has the dense molecular structure, the elastic deformation becomes bad, so that the first inorganic thin film is liable to crack or break under the action of a stress; therefore, the organic thin film 5 and the inorganic thin film 4, which are alternately formed in sequence, are arranged on the first inorganic thin film 41 to increase the elastic deformation of the entire cladding structure, so as to achieve smooth and dense combination of the organic thin film 5 and the pre-encapsulation layer 3; meanwhile, the structure composed of a plurality of thin film groups is more conducive to prevent the water and oxygen from invading the organic light emitting unit 2, thus prolonging the service life of the organic light emitting unit 2.

Preferably, 2-10 thin film groups are arranged, and this can well prevent the invasion of the water and oxygen and can reduce the process complexity.

Preferably, the projection area of the first inorganic thin film 41 on the substrate 1 is larger than or equal to the projection area of the pre-encapsulation layer 3 on the substrate 1. That is, the first inorganic thin film 41 entirely covers the pre-encapsulation layer 3 to prevent the water and oxygen from easily invading the organic light emitting unit 2.

Preferably, in one thin film group, the inorganic thin film 4 covers the organic thin film 5, in this way, the periphery of the organic thin film 5 is not in contact with the outside to prevent the organic thin film 5 from absorbing the external water and oxygen.

Preferably, the thickness of the organic thin film 5 is 100-2000 nm; at this time, the organic thin film 5 can increase the elastic deformation without resulting in a too large thickness of the thin film group.

Preferably, the organic thin film 5 is prepared from any one of parylene, polyurea and acrylic resin. These materials can be cured by ultraviolet light, thereby facilitating the curing operation in the process.

Preferably, the thickness of the inorganic thin film 4 is 100-500 nm; at this time, the inorganic thin film 4 can isolate the water and oxygen without resulting in a too large thickness of the thin film group.

Preferably, the inorganic thin film 4 is prepared from any one of $Al_2O_3$, SiN, $SiO_2$, SiNO, $TiO_2$, $ZrO_2$, ZnO, $MgF_2$ and ZnS.

Preferably, the projection area of the pre-encapsulation layer 3 on the substrate 1 is larger than the projection area of the organic light emitting unit 2 on the substrate 1. The pre-encapsulation layer 3 is directly deposited on the substrate 1, in order to form tighter contact of the first inorganic thin film 41 to be formed on the substrate to serve as a sealing layer and the substrate 1, isolate the contact of the organic light emitting unit 2 from the water and oxygen, effectively prevent the adsorption of the water and oxygen, protect the organic light emitting device from being eroded by the water and oxygen and prolong the service life of the organic light emitting device.

Embodiment 2

This embodiment provides a manufacturing method of the above-mentioned organic light emitting device, including the following steps:

1) forming a pre-encapsulation layer 3 on an organic light emitting unit 2 arranged on a substrate 1;
2) forming a first inorganic thin film 41 on the pre-encapsulation layer 3; and
3) sequentially forming an organic thin film 5 and an inorganic thin film 4 forming a thin film group on the first inorganic thin film 41.

Specifically, the manufacturing method of the organic light emitting device further includes the following steps:

A. preparing the organic light emitting unit on the substrate;

a first electrode 201 and an organic functional layer 202 of the organic light emitting unit 2 are formed on the substrate 1; an insulating layer 205 is formed between the first electrode 201 and the organic functional layer 202; a second electrode 203 is formed on the organic functional layer 202 and the insulating layer 205, and the organic light emitting unit 2 can adopt the existing structure and manufacturing method in the prior art, which will not be repeated redundantly herein one by one.

A buffer layer 204 is formed on the second electrode 203. In this embodiment, a thermal evaporation method is adopted to evaporate a 50 nm thick organic material of tri (8-hydroxyquinoline) aluminum (Alq3) on the second electrode 203 under vacuum of $2e^{-6}$ Torr and at a rate of 1 A/s, in order to form the matched buffer layer 204.

It should be understood that, an N,N'-bi(1-naphthyl)-N, N'-diphenyl-1,1'-biphenyl-4-4'-diamine (NPB) material can also be adopted to prepare the buffer layer 204, the thickness of the buffer layer 204 can be 10-100 nm, and the buffer layer 204 with thickness within the range can effectively improve the light output quantity; the buffer layer 204 can also be prepared from such methods as spin coating, printing and the like. On one hand, the buffer layer 204 can reduce the damage of thin film encapsulation to the organic light emitting unit 2, and on the other hand, the buffer layer can match and optimize the light emission of a top light emitting device.

B. Forming the pre-encapsulation layer on the buffer layer;

The pre-encapsulation layer 3 for encapsulation is formed on the buffer layer 204 by using a mask plate with an opening, the pre-encapsulation layer 3 covers the entire buffer layer 204, for example, the periphery of the pre-encapsulation layer 3 extends outwards for 0.5-2 mm along the edge of the buffer layer 204, and the thickness of the pre-encapsulation layer 3 is 10-100 nm.

That is, the projection area of the pre-encapsulation layer 3 on the substrate 1 is larger than the projection area of the organic light emitting unit 2 on the substrate 1. The pre-encapsulation layer 3 is directly deposited on the substrate 1, in order to form tighter contact of the first inorganic thin film 41 to be formed on the substrate and the substrate 1, isolate the contact of the organic light emitting unit 2 with the water and oxygen, effectively prevent the adsorption of the water and oxygen, protect the organic light emitting device from being eroded by the water and oxygen and prolong the service life of the organic light emitting device.

Specifically, a reactive sputtering method is adopted to sputter an aluminum target under vacuum of 2 mTorr, in an oxygen-argon mixed atmosphere and at the power of 900 W. The mask plate with the opening is arranged between the substrate 1 and plasma, and after penetrating through the opening of the mask plate, the plasma forms a 50 nm thick thin film, for example, an $Al_2O_3$ thin film on the buffer layer 204 at lower energy to form the pre-encapsulation layer 3. The mask plate with the opening is used for protecting the device and ensuring lower energy of the plasma deposited on the buffer layer 204 to reduce the damage of deposition to the organic light emitting device.

It should be understood that, the material of the pre-encapsulation layer 3 is not limited to the above-mentioned material, while can be any one of $Al_2O_3$, SiN, $SiO_2$, SiNO, $TiO_2$, $ZrO_2$, ZnO, $MgF_2$ and ZnS; the preparation process is not limited to the above-mentioned method neither, while other methods can be adopted, such as ion beam sputtering deposition, atomic layer deposition, magnetron sputtering deposition or enhanced chemical vapor deposition, etc.

C. Forming the first inorganic thin film on the pre-encapsulation layer;

The first inorganic thin film 41 is formed on the pre-encapsulation layer 3, and the first inorganic thin film 41 is completely overlapped with the pre-encapsulation layer 3. Due to the protection of the pre-encapsulation layer 3, in the preparation process of the first inorganic thin film 41, no damage is generated to the organic light emitting device; the thickness of the first inorganic thin film 41 can be 100-500 nm.

Specifically, the reactive sputtering method is adopted to sputter the aluminum target under the vacuum of 2 mTorr, in the oxygen-argon mixed atmosphere and at the power of 1200 W, and a 150 nm thick $Al_2O_3$ thin film is deposited on the pre-encapsulation layer 3 to form the first inorganic thin film 41; the first inorganic thin film 41 is prepared at higher power (relative to the pre-encapsulation layer 3). Therefore, the molecular structure is denser; the projection area of the first inorganic thin film 41 on the substrate 1 is larger than or equal to the projection area of the pre-encapsulation layer 3 on the substrate 1. That is, the first inorganic thin film 41 entirely covers the pre-encapsulation layer 3 and the organic light emitting unit 2 to prevent water and oxygen from invading the organic light emitting unit 2 via the pre-encapsulation layer 3 to influence the service life of the organic light emitting unit 2.

The material of the first inorganic thin film 41 is not limited to the above-mentioned material, while can be any one of $Al_2O_3$, SiN, $SiO_2$, SiNO, $TiO_2$, $ZrO_2$, ZnO, $MgF_2$ and ZnS; the preparation process is not limited to the above-mentioned method neither, while other methods can be adopted, such as ion beam sputtering deposition, atomic layer deposition, magnetron sputtering deposition or enhanced chemical vapor deposition, etc.

D. Forming the thin film group with the sequential alternative organic thin film 5 and inorganic thin film 4 on the first inorganic thin film;

The organic thin film 5 is formed on the first inorganic thin film 41, the coverage area of the organic thin film 5 is smaller than the coverage area of the first inorganic thin film 41, and the boundary of the organic thin film is located within the boundary of the first inorganic thin film 41; the thickness of the organic thin film may be 100-2000 nm, and at this time, the organic thin film 5 can increase the elastic deformation without resulting in a too large thickness of the thin film group.

The organic thin film 5 is prepared from an ultraviolet light curable material, such as parylene (Parylene), or polyurea (Polyurea) or acrylic resin or the like.

For example, the parylene is atomized in an ultrasonic atomizer, the atomized parylene forms the organic thin film 5 on the first inorganic thin film 41, and the thickness thereof is 1500 nm; thereafter, the organic thin film 5 is cured under ultraviolet light. The above-mentioned ultrasonic atomization and ultraviolet light curing belong to the prior art, and will not be repeated redundantly herein one by one.

The inorganic thin film 4 is formed on the above-mentioned organic thin film 5, and the inorganic thin film 4 covers the organic thin film 5, therefore the periphery of the organic thin film 5 is not in contact with the outside, so as to prevent the organic thin film 5 from absorbing external water and oxygen.

Specifically, the reactive sputtering method is adopted to sputter a $TiO_2$ target under the vacuum of 2 mTorr, in the oxygen-argon mixed atmosphere and at the power of 1300 W, and a 1000 nm thick $TiO_2$ thin film is deposited on the pre-encapsulation layer 3 to form the inorganic thin film 4; the inorganic thin film 4 is used for preventing the water and oxygen from invading the organic light emitting unit 2 via the pre-encapsulation layer 3 to influence the service life of the organic light emitting unit 2. Meanwhile, in the thin film group, the inorganic thin film 4 covers the organic thin film 5, therefore the periphery of the organic thin film 5 is not in contact with the outside, so as to prevent the organic thin film 5 from absorbing external water and oxygen.

The material of the inorganic thin film 4 is not limited to the above-mentioned material, while can be any one of $Al_2O_3$, SiN, $SiO_2$, SiNO, $TiO_2$, $ZrO_2$, ZnO, $MgF_2$ and ZnS; the preparation process is not limited to the above-mentioned method neither, while other methods can be adopted, such as ion beam sputtering deposition, atomic layer deposition, magnetron sputtering deposition or enhanced chemical vapor deposition, etc.

Since the first inorganic thin film 41 has the dense molecular structure, the elastic deformation becomes bad, so that the first inorganic thin film is liable to crack or break under the action of a stress; therefore, thin film group consisted of the organic thin film 5 and the inorganic thin film 4, which are alternately formed in sequence, are arranged on the first inorganic thin film 41 to increase the elastic deformation of the entire cladding structure, so as to achieve the smooth and dense combination of the organic thin film 5 and the inorganic thin film 4; meanwhile, the structure consisted of a plurality of thin film groups is more conducive to prevent the water and oxygen from invading the organic light emitting unit 2, thus prolonging the service life of the organic light emitting unit 2.

The above steps are repeated to prepare a thin film group including the inorganic thin film 4 and the organic thin film 5 again, so that two thin film groups are sequentially arranged on the first inorganic thin film 41, and each thin film group includes the organic thin film 5 and the inorganic thin film 4 covering the organic thin film 5; it should be understood that, 2-10 thin film groups can be arranged, and this can well prevent the invasion of the water and oxygen and can reduce the process complexity.

The peripheries of all the inorganic thin films 4 are in contact with each other and are mutually overlapped, and all the organic thin films 5 are wrapped in the inorganic thin films 4 at intervals.

In the organic light emitting device and the manufacturing method thereof provided by the present invention, the first inorganic thin film 41 entirely covers the pre-encapsulation layer 3 and the organic light emitting unit 2, and the first inorganic thin film 41 has a denser molecular structure compared with the pre-encapsulation layer 3, thereby effectively preventing water and oxygen from invading the organic light emitting unit 2 via the pre-encapsulation layer 3 to influence the service life of the organic light emitting unit 2.

The embodiment of the present invention further provides a display device, including the above-mentioned organic light emitting device, and since the organic light emitting device has the above-mentioned encapsulation structure, the display device has the advantages of strong reliability and long service life. The display device can be any display apparatus, such as a mobile phone, a television, a digital camera or the like.

It can be understood that, the foregoing implementations are merely exemplary implementations used for illustrating the principle of the present invention, but the present invention is not limited hereto. Those of ordinary skill in the art can make a variety of modifications and improvements without departing from the spirit and essence of the present invention, and these modifications and improvements shall fall within the protection scope of the present invention.

The invention claimed is:

1. A manufacturing method of an organic light emitting device, comprising:
    forming a pre-encapsulation layer on a substrate provided with an organic light emitting unit, wherein the pre-encapsulation layer covers the organic light emitting unit, wherein the pre-encapsulation layer is an inorganic thin film; and
    forming a first inorganic thin film on the pre-encapsulation layer, and has a denser molecular structure compared with the pre-encapsulation layer;
    wherein the first inorganic thin film is formed under a same process condition as the pre-encapsulation layer, but with a higher power than the pre-encapsulation layer.

2. The manufacturing method of the organic light emitting device of claim 1, further comprising:
    sequentially forming at least one thin film group on the first inorganic thin film, wherein each thin film group comprises an organic thin film and an inorganic thin film.

3. The manufacturing method of the organic light emitting device of claim 2, wherein in each thin film group, the inorganic thin film covers the organic thin film.

4. The manufacturing method of the organic light emitting device of claim 2, wherein,
    the at least one thin film group is provided in a range from 2 to 10 thin film groups.

5. The manufacturing method of the organic light emitting device of claim 4, wherein,
    a projection area of the first inorganic thin film on the substrate is larger than or equal to a projection area of the pre-encapsulation layer on the substrate.

6. The manufacturing method of the organic light emitting device of claim 5, wherein,
    in each thin film group, the inorganic thin film covers the organic thin film.

7. The manufacturing method of the organic light emitting device of claim 4, wherein,
    in each thin film group, the inorganic thin film covers the organic thin film.

8. The manufacturing method of the organic light emitting device of claim 2, wherein,
    a projection area of the first inorganic thin film on the substrate is larger than or equal to a projection area of the pre-encapsulation layer on the substrate.

9. The manufacturing method of the organic light emitting device of claim 8, wherein,
    in each thin film group, the inorganic thin film covers the organic thin film.

10. The manufacturing method of the organic light emitting device of claim 2, wherein,
    a thickness of the organic thin film is 100-2000 nm.

11. The manufacturing method of the organic light emitting device of claim 2, wherein,
    the organic thin film is made of any one of parylene, polyurea and acrylic resin.

12. The manufacturing method of the organic light emitting device of claim 2, wherein,
    a thickness of the inorganic thin film is 100-500 nm.

13. The manufacturing method of the organic light emitting device of claim 2, wherein, the inorganic thin film is made of any one of Al2O3, SiN, SiO2, SiNO, TiO2, ZrO2, ZnO, MgF2 and ZnS.

14. The manufacturing method of the organic light emitting device of claim 2, wherein,
peripheries of all the inorganic thin films are in contact with each other and are mutually overlapped, and all the organic thin films are wrapped in the inorganic thin films at intervals.

15. The manufacturing method of the organic light emitting device of claim 1, wherein,
a projection area of the first inorganic thin film on the substrate is larger than or equal to a projection area of the pre-encapsulation layer on the substrate.

16. The manufacturing method of the organic light emitting device of claim 1, wherein,
a projection area of the pre-encapsulation layer on the substrate is larger than a projection area of the organic light emitting unit on the substrate.

\* \* \* \* \*